US007340070B2

(12) United States Patent
Nakata

(10) Patent No.: US 7,340,070 B2
(45) Date of Patent: Mar. 4, 2008

(54) VOICE-DATA PROCESSING CIRCUIT AND VOICE-DATA PROCESSING METHOD

(75) Inventor: Kazuhiro Nakata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 800 days.

(21) Appl. No.: 10/857,502

(22) Filed: Jun. 1, 2004

(65) Prior Publication Data

US 2004/0247109 A1 Dec. 9, 2004

(30) Foreign Application Priority Data

Jun. 6, 2003 (JP) ............................ 2003-162642

(51) Int. Cl.
*H03G 3/20* (2006.01)
*H04R 3/00* (2006.01)

(52) U.S. Cl. ................ 381/110; 381/123; 379/387.01; 370/351

(58) Field of Classification Search ................ 381/110, 381/123; 379/387.01, 399.01; 370/351
See application file for complete search history.

(56) References Cited

U.S. PATENT DOCUMENTS 5,589,830 A * 12/1996 Linz et al. .................. 341/110
5,661,811 A 8/1997 Huemann et al.
6,259,957 B1 * 7/2001 Alexander et al. ............ 700/94
6,769,603 B2 * 8/2004 Nagai et al. ................ 235/375
2003/0236583 A1 * 12/2003 Baumgarte et al. ........... 700/94

FOREIGN PATENT DOCUMENTS

EP 0873041 A1 10/1998
JP 7-30497 A 1/1995

OTHER PUBLICATIONS

D. P. Vogel et al, "Software Audio part," Philips Semiconductors User Manual, SAA7709H/N107, 2002, pp. 30-31, 193-194.

* cited by examiner

*Primary Examiner*—Vivian Chin
*Assistant Examiner*—Con P. Tran
(74) *Attorney, Agent, or Firm*—Sughrue Mion, PLLC

(57) ABSTRACT

When selecting a specific input source that can be processed by only a second voice-data processing unit instead of an input source currently being processed by a first voice-data processing unit, a voice-data processing circuit selects and delivers an input source selected by a second analog switch to the first voice-data processing unit by using a first analog switch. Then, after the first and second voice-data processing units simultaneously process the identical input source other than the specific input source over a certain time period, the second analog switch selects and delivers the specific input source to the second voice-data processing unit and a first switch selects an output of the second voice-data processing unit and outputs a voice of the specific input source as an analog audio output.

10 Claims, 5 Drawing Sheets

| TIME | T | 2T | 3T | 4T | 5T | 6T |
|---|---|---|---|---|---|---|
| DATA VALUE OF DATA SEQUENCE 13 | A | B | C | D | E | F |
| DATA VALUE OF DATA SEQUENCE 14 | A' | B' | C' | D' | E' | F' |

FIG.5

| STEP | ST1 (INITIAL STATE) | ST3 | ST4 | ST5 |
|---|---|---|---|---|
| MUTING UNIT 19 | OFF | ON ※ | ON | ON |
| MUTING UNIT 20 | OFF | OFF | OFF | OFF |
| ANALOG SW5 | AUDIO SOURCE 2 | AUDIO SOURCE 2 | AUDIO SOURCE 3 ※ | AUDIO SOURCE 3 |
| ANALOG SW6 | AUDIO SOURCE 3 | AUDIO SOURCE 3 | AUDIO SOURCE 3 | AUDIO SOURCE 3 |
| SWITCH 15 | DATA SEQUENCE 13 | DATA SEQUENCE 13 | DATA SEQUENCE 13 | DATA SEQUENCE 13 |
| SWITCH 16 | DATA SEQUENCE 14 | DATA SEQUENCE 14 | DATA SEQUENCE 14 | DATA SEQUENCE 13 ※ |
| SOUND SIGNAL OF ANALOG AUDIO OUTPUT 23 | AUDIO SOURCE 2 | MUTE ※ | MUTE | MUTE |
| SOUND SIGNAL OF ANALOG AUDIO OUTPUT 24 | AUDIO SOURCE 3 | AUDIO SOURCE 3 | AUDIO SOURCE 3 | AUDIO SOURCE 3 |

FIG.6

| STEP | ST6 | ST7 | ST8 |
|---|---|---|---|
| MUTING UNIT 19 | ON | ON | OFF ※ |
| MUTING UNIT 20 | OFF | OFF | OFF |
| ANALOG SW5 | AUDIO SOURCE 3 | AUDIO SOURCE 3 | AUDIO SOURCE 3 |
| ANALOG SW6 | AUDIO SOURCE 1 ※ | AUDIO SOURCE 1 | AUDIO SOURCE 1 |
| SWITCH 15 | DATA SEQUENCE 13 | DATA SEQUENCE 14 ※ | DATA SEQUENCE 14 |
| SWITCH 16 | DATA SEQUENCE 13 | DATA SEQUENCE 13 | DATA SEQUENCE 13 |
| SOUND SIGNAL OF ANALOG AUDIO OUTPUT 23 | MUTE | MUTE ※ | AUDIO SOURCE 3 ※ |
| SOUND SIGNAL OF ANALOG AUDIO OUTPUT 24 | AUDIO SOURCE 3 | AUDIO SOURCE 3 | AUDIO SOURCE 3 |

VOICE-DATA PROCESSING CIRCUIT AND VOICE-DATA PROCESSING METHOD

BACKGROUND OF THE INVENTION

1. Field of the Invention

The present invention relates to a voice-data processing circuit for and a voice-data processing method of simultaneously processing two voice data.

2. Description of Related Art

In general, a voice-data processing circuit that can simultaneously process two voice data is provided with two sets of an analog input source switch, an A/D converter, a signal-processing means, a D/A converter, and so on. Therefore, such a voice-data processing circuit can process two sets of analog input signals which are different from each other by making them pass through different signal paths, and then outputs the processed signals as voices independent of each other. In case where an analog signal is input to this type of DSP (Digital Signal Processor), it is applied to a first A/D converter or a second A/D converter and is then converted into voice data. However, when selecting an FM signal as an input source, the DSP has no other choice but to use the second A/D converter in order to convert the FM signal into voice data. When outputting different analog audio sources other than FM signals by way of the different signal processing paths, respectively, if the DSP tries to change the input source applied to one of the two paths via which a voice is output by using the first A/D converter to an FM signal, and to maintain the current input source applied to the other one of the two paths via which a voice is output by using the second A/D converter, the DSP has to switch the currently-selected analog source from the other path via which a voice is output by using the second A/D converter to the path via which a voice is output by using the first A/D converter in order to input the FM signal to the second A/D converter.

However, this results in a switching of an analog switch intended for selection of an input source and located at the front of the first A/D converter, and therefore an unusual sound comes out from the corresponding signal processing path. There has been provided a method of performing a muting process in order to prevent a generation of such an unusual sound (for example, refer to Philips Semiconductors User Manual SAA7709H/N107 Software Audio part Version 1.0, pages 30 to 31 and 193 to 194).

A problem with the prior art voice-data processing circuit disclosed by the above-mentioned non-patent prior art reference is however that a muting process causes a sound skip and there causes a feeling of wrongness in a voice (i.e., a voice output via a signal processing path that is switched from the first A/D converter to the second A/D converter) outputted via a signal processing path on which no switching between input sources is performed.

SUMMARY OF THE INVENTION

The present invention is made in order to solve the above-mentioned problem, and it is therefore an object of the present invention to provide a voice-data processing circuit for and a voice-data processing method of, when switching from an input source to another input source that introduces a certain restriction on voice-data processing performed via a signal processing path, preventing any unusual sound and any sound skip from being generated in a voice outputted via another signal processing path on which no switching between input sources is performed without causing any feeling of wrongness in the voice.

In accordance with the present invention, there is provided a voice-data processing circuit including: a first source selection unit for selecting one input source from a plurality of input sources; a second source selection unit for selecting one input source from the plurality of input sources; a first voice-data processing unit for processing the input source selected by the first source selection unit; a second voice-data processing unit for processing the input source selected by the second source selection unit; a first path switching unit for selecting one of outputs of the first and second voice-data processing unit and for outputting the selected output as a first voice output; and a second path switching unit for selecting one of the outputs of the first and second voice-data processing unit and for outputting the selected output as a second voice output, when selecting a specific input source that can be processed by only the second voice-data processing unit instead of an input source currently being processed by the first voice-data processing unit, the first source selection unit selecting and delivering the input source selected by the second source selection unit to the first voice-data processing unit, the first and second voice-data processing units simultaneously processing the identical input source other than the specific input source over a certain time period, the second source selection unit then selecting and delivering the specific input source to the second voice-data processing unit, and the first path switching unit selecting the output of the second voice-data processing unit and outputting a voice of the specific input source as the first voice output.

Therefore, when switching from an input source to another input source that introduces a certain restriction on voice-data processing performed via a signal processing path, the voice-data processing circuit in accordance with the present invention can prevent any unusual sound and any sound skip from being generated in a voice outputted via another signal processing path on which no switching between input sources is performed without causing any feeling of wrongness in the voice.

Further objects and advantages of the present invention will be apparent from the following description of the preferred embodiments of the invention as illustrated in the accompanying drawings.

BRIEF DESCRIPTION OF THE DRAWINGS

FIG. 5 is a diagram showing a state transition of each component of FIG. 1 in each of steps ST1 to ST5 of FIG. 2; and FIG. 6 is a diagram showing a state transition of each component of FIG. 1 in each of steps ST6 to ST8 of FIG. 2.

DETAILED DESCRIPTION OF THE PREFERRED EMBODIMENT

The preferred embodiment of the present invention will be now described with reference to the accompanying drawings.

Embodiment 1

Figure 1:
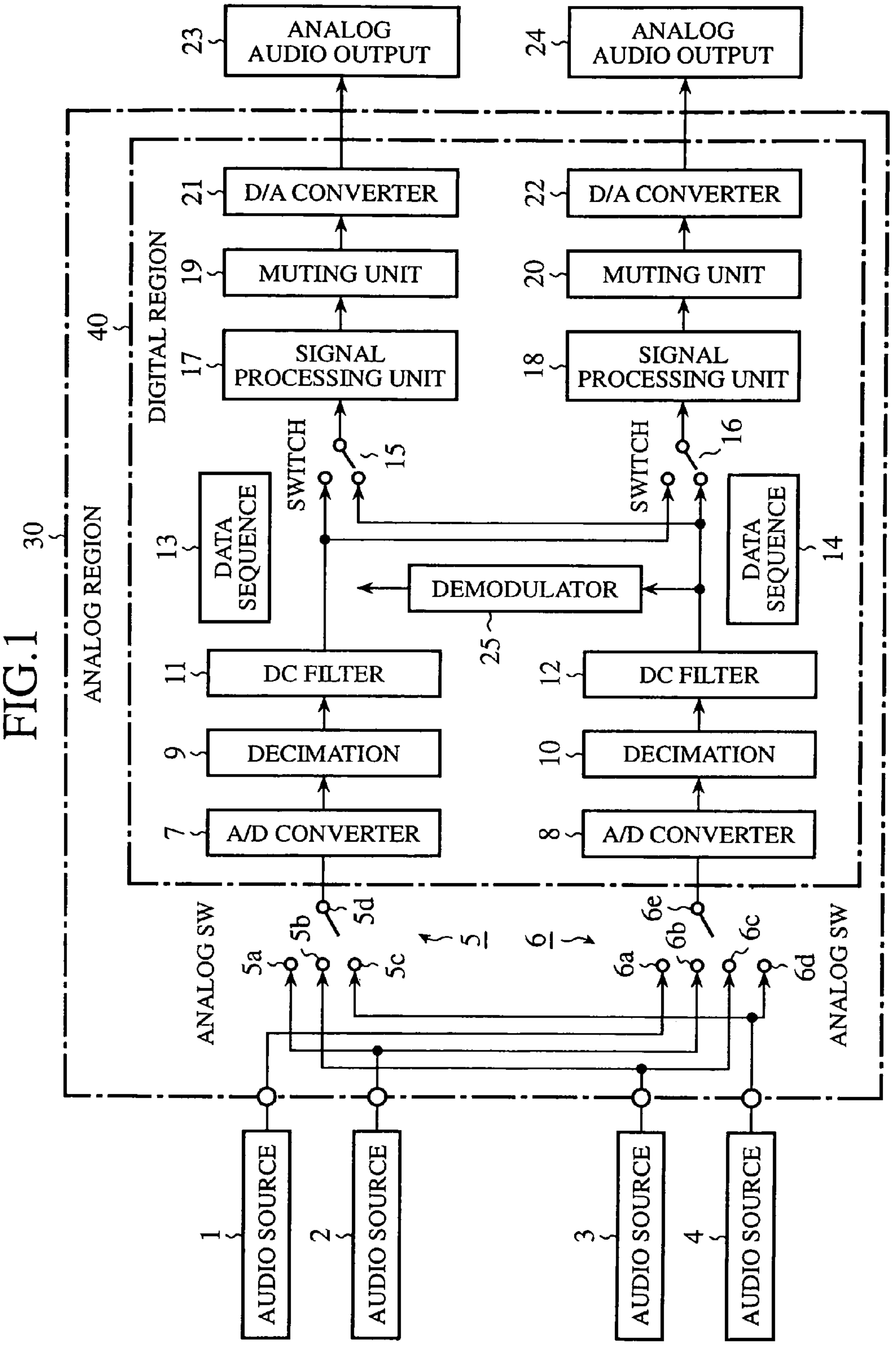
FIG. 1 is a system block diagram showing a voice-data processing circuit in accordance with embodiment 1 of the present invention.
Figure 2:
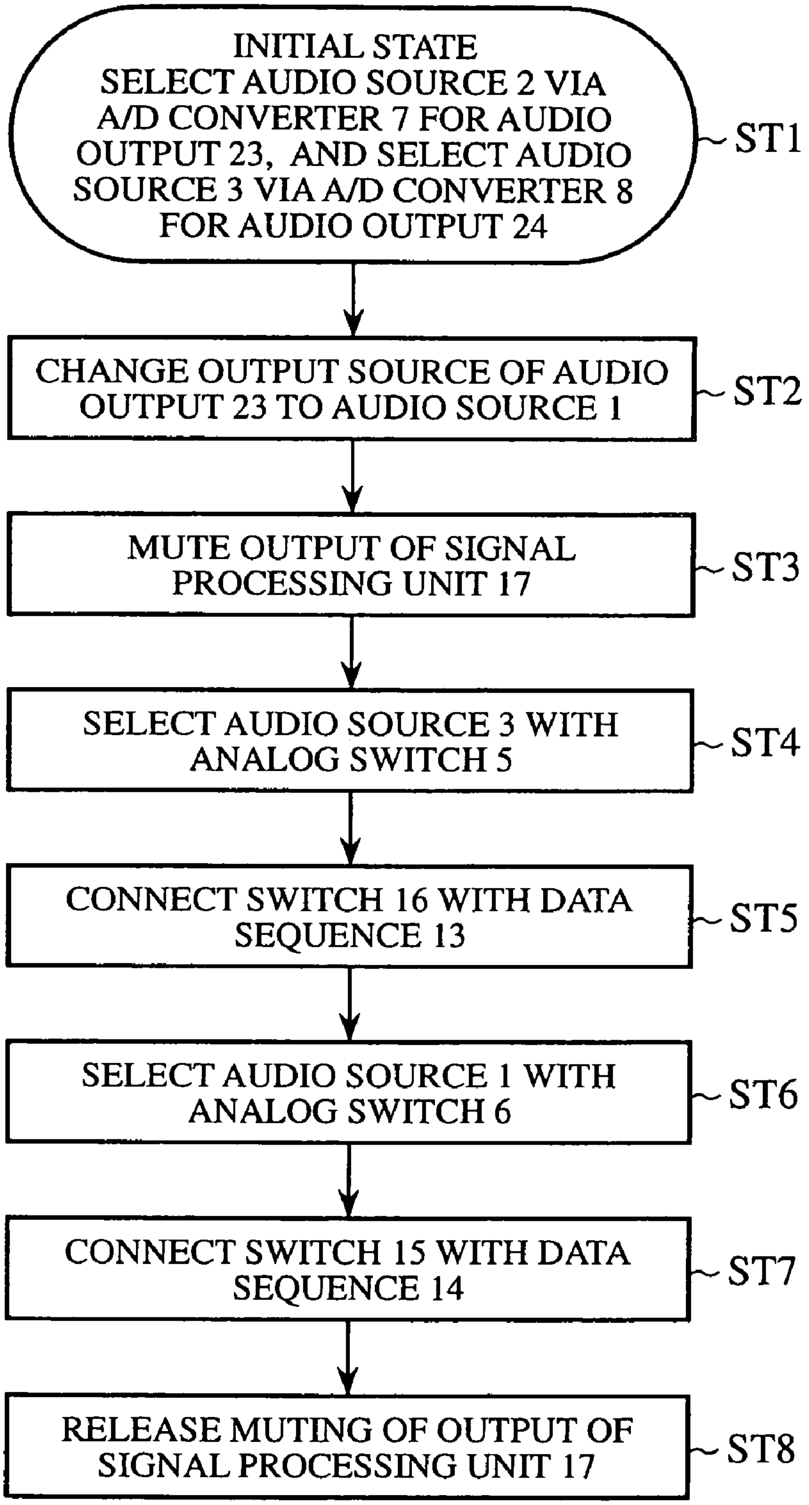
FIG. 2 is a flow chart showing the operation of the voice-data processing circuit in accordance with embodiment 1 of the present invention.

FIG. 1 is a system block diagram showing a voice-data processing circuit in accordance with embodiment 1 of the present invention, and FIG. 2 is a flow chart showing the operation of the voice-data processing circuit in accordance with embodiment 1 of the present invention.

As shown in FIG. 1, input audio sources 1, 2, 3, and 4, such as a radio, a cassette tape, and a CD, are connected to an analog portion 30 of the voice-data processing circuit, and analog switches 5 and 6 are disposed, as first and second source selection means, for selecting one of those audio sources 1, 2, 3 and 4, respectively, in the analog portion 30 of the voice-data processing circuit. The first audio source 1 is connected to a first contact terminal 6*a* of the second analog switch 6, the second audio source 2 is connected to both a first contact terminal 5*a* of the first analog switch 5 and a second contact terminal 6*b* of the second analog switch 6, the third audio source 3 is connected to both a second contact terminal 5*b* of the first analog switch 5 and a third contact terminal 6*c* of the second analog switch 6, and the fourth audio source 4 is connected to both a third contact terminal 5*c* of the first analog switch 5 and a fourth contact terminal 6*d* of the second analog switch 6.

A switching terminal 5*d* of the first analog switch 5 is connected to an input of a first A/D converter 7 disposed in a digital portion 40, for converting an input analog audio source into voice data, and a switching terminal 6*e* of the second analog switch 6 is connected to an input of a second A/D converter 8, for converting an input analog audio source into voice data.

The first and second A/D converters 7 and 8 have outputs connected to inputs of first and second decimation filters 9 and 10 each for decimating data which lie outside a predetermined band. The first and second decimation filters 9 and 10 have outputs connected to first and second DC filters 11 and 12 for respectively removing DC offsets of the outputs of the first and second A/D converters 7 and 8, respectively. The first and second DC filters 11 and 12 output the voice-data sequences 13 and 14 to be processed at the back thereof, respectively.

Both first and second switches 15 and 16 are connected, as first and second path switching means each for selecting either the first voice-data sequence 13 or the second voice-data sequence 14, to an output of each of the first and second DC filters 11 and 12. The first and second switches 15 and 16 supply either the selected voice-data sequence 13 or the selected voice-data sequence 14 to first and second signal processing units 17 and 18 disposed at the back of the first and second switches, each for controlling the tone quality, sound volume, etc., respectively.

The first and second signal processing units 17 and 18 have outputs connected, via muting means 19 and 20, to inputs of first and second D/A converters 21 and 22 each for converting voice data back into an analog wave, respectively. These D/A converters 21 and 22 then output first and second analog audio outputs 23 and 24 to which voice data are digital-to-analog converted thereby, as first and second voice outputs, respectively.

A demodulator 25 for decoding FM RDS (Radio Data System) data is also connected to the output of the second DC filter 12. Since the demodulator 25 outputs digital data which is not related to any voice at all, the voice-data processing circuit sends it to a microcomputer or the like in synchronization with a clock signal so that the microcomputer or the like can analyze and display the RDS data. The first A/D converter 7, the first decimation filter 9, and the first A/D converter 11 constitute a first voice-data processing means, and the second A/D converter 8, the second decimation filter 10, and the second A/D converter 12 constitute a second voice-data processing means. The first signal processing unit 17, the first muting means 19, and the first D/A converter 21 constitute a first signal processing means, and the second signal processing unit 18, the second muting means 20, and the second D/A converter 22 constitute a second signal processing means.

Next, the operation of the voice-data processing circuit in accordance with embodiment 1 of the present invention will be explained with reference to FIG. 2. Assume that in a case where the first audio source 1 is a wide band signal, such as an FM signal, including an RDS signal or the like, only the second A/D converter 8 can carry out A/D conversion of the wide band signal. That is, it is assumed that it is necessary to accept the first audio source by way of the second A/D converter 8 in order to use the first audio source 1.

It is further assumed that the voice-data processing circuit, in step ST1, connects the switching terminal 5*d* of the first analog switch 5 to the first contact terminal 5*a* of the first analog switch 5 to select the second audio source 2, selects a voice-data sequence 13 using the first switch 15, and reproduces the second audio source 2, as the first analog audio output 23, through the first signal processing unit 17, and the voice-data processing circuit, in step ST1, also connects the switching terminal 6*e* of the second analog switch 6 to the third contact terminal 6*c* of the second analog switch 6 to select the third audio source 3, selects a voice-data sequence 14 with the second switch 16, and reproduces the third audio source 3, as the second analog audio output 24, through the second signal processing unit 18.

Further assume that the voice-data processing circuit then, in step ST2, changes the input source corresponding to the first analog audio output 23 to the first audio source 1 without changing the input source corresponding to the second analog audio output 24. When this change is carried out, there must not be any occurrence of a mute and a sound skip and any generation of an unusual sound in the second analog audio output 24 for which no change of the input source is required. First, the voice-data processing circuit prevents the first analog audio output 23 from coming out via the first D/A converter 21 by muting the output of the first signal processing unit 17 using the first muting means 19 (in step ST3).

The voice-data processing circuit then connects the switching terminal 5*d* of the first analog switch 5 to the second contact terminal 5*b* of the first analog switch 5 to select the third audio source 3 (in step ST4). In this state, the third audio source 3 is simultaneously analog-to-digital converted by both the first and second A/D converters 7 and 8. In other words, both the first voice-data processing unit 7, 9 and 11 and the second voice-data processing unit 8, 10 and 12 are made to simultaneously process the identical input source 3 over a certain time period. Then the voice-data processing circuit selectively delivers the first voice-data sequence 13 to the second signal processing unit 18 using the second switch 16 (in step ST5). In other words, the voice-data processing circuit switches the data inputted into the second signal processing unit 18 from the second voice-data sequence 14 to the first voice-data sequence 13 without muting the second analog audio output 24, and no unusual sound occurs unless any sinusoidal wave having a frequency close to one half of the sampling frequency is input to the second signal processing unit 18.

Figures 3, 4:
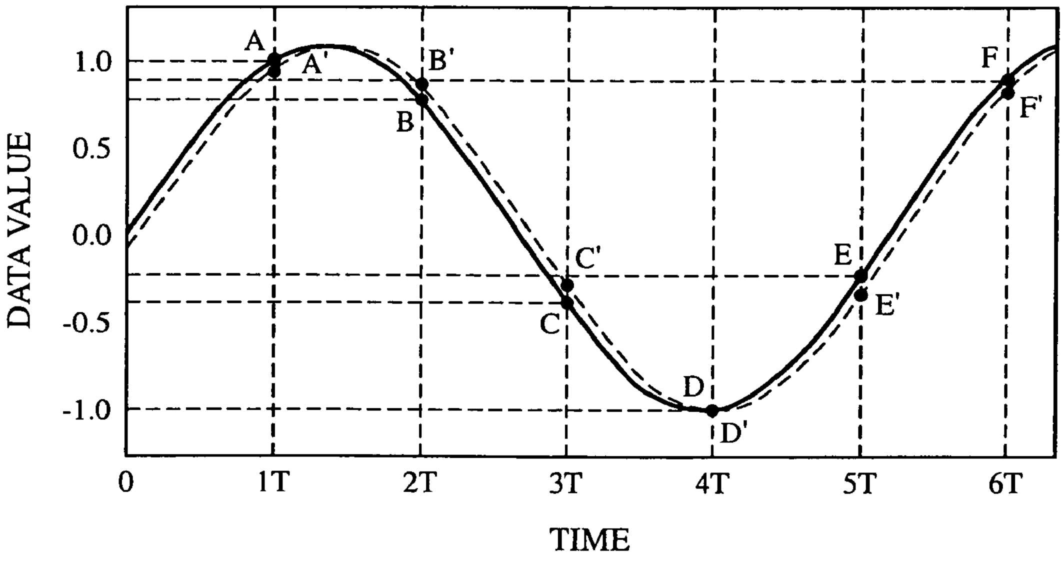
FIG. 3 is a diagram showing values of each voice-data sequence at sampling times in each of steps ST4 and ST5 of FIG. 2.
FIG. 4 is a diagram showing the values of each voice-data sequence at the sampling times of FIG. 3.

Next, a method of switching between the two signal processing paths while simultaneously processing the same input source through the two signal processing paths will be explained with reference to FIGS. 3 and 4. FIG. 3 is a diagram showing values of each voice-data sequence at sampling times in each of steps ST4 and ST5 of FIG. 2, and FIG. 4 is a diagram showing the values of each voice-data sequence at the sampling times of FIG. 3.

In general, an A/D converter in ay DSP converts an analog signal inputted at predetermined intervals of a sampling period T into discrete value data. When the voice-data processing circuit simultaneously carries out A/D conversion of the third audio source 3 by using both the first and second A/D converters 7 and 8, in step ST4 of FIG. 2, data A, B, C, . . . at the sampling times of the first voice-data sequence 13 should have much the same values as data A', B', C', . . . at the sampling times of the second voice-data sequence 14. That is, in FIG. 3, the following relationships: A→A', B→B', C→C', D→D', E→E', and F→F' are established. A time-base graph representing these relationships is shown in FIG. 4. In FIG. 4, a solid line and a broken line are examples of analog waves to which the first and second voice-data sequences 13 and 14 are digital-to-analog converted after subjected to interpolation processing, respectively.

Assuming that the second switch 16 selects the second voice-data sequence 14 before the sampling time 3T and selects the first voice-data sequence 13 after the next sampling time 4T, data transmitted to the second signal processing unit 18 after the first sampling time T are as follows: A'→B'→C'→D→E→F. Since the data at the sampling times of the first voice-data sequence 13 have much the same values as the data at the sampling times of the second voice-data sequence 14, as mentioned above, the data transmitted to the second signal processing unit 18 are almost equivalent to A→B→C→D→E→F. The continuity of the data in the discrete region required for the reproduction of an analog continuous wave in the analog region can be nearly maintained. When the continuity of the data is maintained, a smooth analog waveform can be obtained by interpolation processing for the D/A conversion and no adverse effect due to the switching of the second switch 16 is produced. Actually, when a sinusoidal wave of a frequency close to one half of the sampling frequency is input, a phase difference generated at the time of A/D conversion or postprocessing cannot be disregarded and an unusual sound can be generated while this phase difference can be disregarded for general music signals and signals of relatively low frequencies.

After switching between the signal processing paths by using the second switch 16, the voice-data processing circuit connects the switching terminal 6*e* of the second analog switch 6 to the first contact terminal 6*a* of the second analog switch 6 to select the first audio source 1 (in step ST6). The voice-data processing circuit switches the first switch 15 to the connection with the first voice-data sequence 14 to select the first voice-data sequence 14 (in step ST7). Finally, by releasing the muting by the muting means 19 which has entered a muting state in step ST3 (in step ST8), the voice-data processing circuit can change the input source corresponding to the first analog audio output 23 from the second audio source 2 to the first audio source 1 without muting the second analog audio output 24 and generating any sound skip and any unusual sound in the second analog audio output 24.

FIG. 5 is a diagram showing a state transition of each component of FIG. 1 in each of the above-mentioned steps ST1 to ST5 of FIG. 2, and FIG. 6 is a diagram showing a state transition of each component of FIG. 1 in each of the above-mentioned steps ST6 to ST8 of FIG. 2. In FIGS. 5 and 6, an item designated by * shows a state transition from a state in a previous step.

Thus, in accordance with this embodiment 1, when switching from an input source to another input source that introduces a certain restriction on voice-data processing performed via a signal processing path, the voice-data processing circuit can prevent any unusual sound and any sound skip from being generated in a voice outputted via another signal processing path on which no switching between input sources is performed without causing any feeling of wrongness in the voice.

Many widely different embodiments of the present invention may be constructed without departing from the spirit and scope of the present invention. It should be understood that the present invention is not limited to the specific embodiments described in the specification, except as defined in the appended claims.

What is claimed is:

1. A voice-data processing circuit comprising:

a first source selection means for selecting one input source from a plurality of input sources;

a second source selection means for selecting one input source from the plurality of input sources;

a first voice-data processing means for processing the input source selected by said first source selection means;

a second voice-data processing means for processing the input source selected by said second source selection means;

a first path switching means for selecting one of outputs of said first and second voice-data processing means and for outputting the selected output as a first voice output; and a second path switching means for selecting one of the outputs of said first and second voice-data processing means and for outputting the selected output as a second voice output, when selecting a specific input source that can be processed by only said second voice-data processing means instead of an input source currently being processed by said first voice-data processing means, said first source selection means selecting and delivering an input source currently being selected by said second source selection means to said first voice-data processing means, said first and second voice-data processing means simultaneously processing the identical input source other than said specific input source over a certain time period, said second source selection means then selecting and delivering said specific input source to said second voice-data processing means, and said first path switching means selecting the output of said second voice-data processing means and outputting a voice of said specific input source as said first voice output.

2. The voice-data processing circuit according to claim 1, wherein said plurality of input sources are audio sources, and said specific input source is a wide band signal including an RDS signal.

3. The voice-data processing circuit according to claim 2, wherein each of said first and second voice-data processing means is provided with an A/D converter, a decimation filter, and a DC filter.

4. The voice-data processing circuit according to claim 3, wherein said circuit further comprises a first signal processing means disposed behind said first path switching means and provided with at least a muting means and a D/A converter, and a second signal processing means disposed behind said second path switching means and provided with at least a muting means and a D/A converter.

5. The voice-data processing circuit according to claim 2, wherein said circuit further comprises a first signal processing means disposed behind said first path switching means and provided with at least a muting means and a D/A converter, and a second signal processing means disposed behind said second path switching means and provided with at least a muting means and a D/A converter.

6. The voice-data processing circuit according to claim 1, wherein each of said first and second voice-data processing means is provided with an A/D converter, a decimation filter, and a DC filter.

7. The voice-data processing circuit according to claim 6, wherein said circuit further comprises a first signal processing means disposed behind said first path switching means and provided with at least a muting means and a D/A converter, and a second signal processing means disposed behind said second path switching means and provided with at least a muting means and a D/A converter.

8. The voice-data processing circuit according to claim 1, wherein said circuit further comprises a first signal processing means disposed behind said first path switching means and provided with at least a muting means and a D/A converter, and a second signal processing means disposed behind said second path switching means and provided with at least a muting means and a D/A converter.

9. A voice-data processing method of acquiring voice outputs by using first and second voice-data processing means each for processing a selected input source, said method comprising the steps of:

selecting two different input sources other than said specific input source from a plurality of input sources, and inputting them into said first and second voice-data processing means, respectively;

acquiring a first voice output by selecting an output of said first voice-data processing means, and a second voice output by selecting an output of said second voice-data processing means;

when selecting a specific input source that can be processed by only said second voice-data processing means instead of an input source currently being input to said first voice-data processing means, selecting and delivering one of the two different input sources currently being input to said second voice-data processing means to said first voice-data processing means;

causing said first and second voice-data processing means to simultaneously process the identical input source over a certain time period, and, after that, selecting and keeping the output of said first voice-data processing means as said second voice output; and selecting and delivering said specific input source to said second voice-data processing means and selecting the output of said second voice-data processing means as said first voice output so as to acquire a voice of said specific input source.

10. The voice-data processing method according to claim 9, wherein said plurality of input sources are audio sources, and said specific input source is a wide band signal including an RDS signal.

* * * * *